United States Patent [19]

Ueba et al.

[11] Patent Number: 5,252,546
[45] Date of Patent: Oct. 12, 1993

[54] PROCESS FOR PRODUCING AN ORGANIC SUPERCONDUCTIVE MATERIAL

[75] Inventors: Yoshinobu Ueba, Osaka, Japan; Yoshiyuki Okamoto, Brooklyn, N.Y.

[73] Assignee: Sumitomo Electric Industries, Ltd., Osaka, Japan

[21] Appl. No.: 417,103

[22] Filed: Oct. 4, 1989

[30] Foreign Application Priority Data

Oct. 5, 1988 [JP] Japan ............... 63-252745

[51] Int. Cl.$^5$ ........................... H01L 39/24
[52] U.S. Cl. ........................ 505/1; 505/802; 505/811; 505/815; 505/818; 252/500; 204/59 R
[58] Field of Search ............... 252/500, 518; 505/1, 505/802, 811, 815, 818; 204/59 R

[56] References Cited

U.S. PATENT DOCUMENTS 4,632,776  12/1986  Williams et al. ............ 505/802
5,082,687   1/1992  Ueba et al. ................. 505/811

FOREIGN PATENT DOCUMENTS 0308907  3/1989  European Pat. Off. .
 308907  3/1989  European Pat. Off. .
0366970  5/1990  European Pat. Off. .

OTHER PUBLICATIONS

Kini et al., "(MDT-TTF)$_2$AuI$_2$: An Ambient Pressure Organic Superconductor", *Sol. State Comm.* vol. 69(5), pp. 503-507, 1989.

"Superconductivity in Polysulfur Nitride (SN)x", Greene et al. Physical Review Letters, vol. 34, No. 10, Mar. 1975, pp. 577-579.

Ambient-Pressure Superconductivity at the Highest Temperature (5K) Observed in Organic System: beta-(-BEDT-TTF)2AuI2, Wang et al, Inorganic Chemistry, vol. 24, No. 16, No. 16, Jul. 31, 1985, pp. 2465-2466.

"The fabrication of ceramic superconducting wire", Lusk et al, Superconductor Science and Technology, vol. 1, Aug. 1988, pp. 137-140.

*Primary Examiner*—Paul Lieberman
*Assistant Examiner*—Bradley A. Swope
*Attorney, Agent, or Firm*—Sughrue, Mion, Zinn, Macpeak & Seas

[57] ABSTRACT

An organic superconductive material and a process for producing the same are disclosed, the material comprising a polymer having dispersed therein an organic superconductive substance comprising an electron donor and an electron acceptor.

6 Claims, No Drawings

PROCESS FOR PRODUCING AN ORGANIC SUPERCONDUCTIVE MATERIAL

FIELD OF THE INVENTION

This invention relates to an organic superconductive material having excellent processability and a process for producing the same.

BACKGROUND OF THE INVENTION

Known organic super-conductive substances having a critical temperature (Tc) of 10K or higher include cation radical salts having a low molecular weight, such as a Cu(NCS)$_2$ salt of bis(ethylenedithiatetra-thia)fulvalene (hereinafter abbreviated as "BEDT-TTF", the Cu(NCS)$_2$ salt thereof being represented by "(BEDT-TTF)$_2$Cu(NCS)$_2$") (Tc: 10. 4K) and deuterated (BEDT-TTF)$_2$Cu (NCS)$_2$ ((BEDT-TTFd$_8$)$_2$Cu(NCS)$_2$; Tc: 11K) as described in H. Urayama et al., Chem. Lett., p. 55 (1988).

(BEDT-TTF)$_2$Cu(NCS)$_2$ can be obtained by electrochemical oxidation of BEDT-TTF, effected by applying a direct electrical current through a solution of BEDT-TTF in 1, 1, 2-trichloroethane in the presence of CuSCN, KSCN, and 18-crown-6-ether as described in H. Urayama et al., Chem. Lett., p. 55 (1988).

However, it has been difficult to process and shape these conventionally known organic superconductive substances into fibers, films, etc., because of their very fine and brittle crystals. The difficulty of processing has been a bar to sufficient industrialization of organic superconductive substances.

SUMMARY OF THE INVENTION

An object of this invention is to provide an organic superconductive material which can be easily processed and shaped into fibers, films, etc.

Another object of this invention is to provide a process for producing the above-described organic superconductive material.

Other objects and effects of the present invention will be apparent from the following description.

It has now been found that the above objects of this invention are accomplished by an organic superconductive material comprising a polymer having dispersed therein an organic superconductive substance comprising an election donor and an electron acceptor.

The organic superconductive material according to the present invention can be obtained by a process comprising subjecting a solution of an electron-donating material and an electron-accepting material in a solvent to electrochemical oxidation-reduction to synthesize an organic superconductive and removing the solvent, wherein said oxidation-reduction and removal of the solvent and unreacted electron-donating material and electron-accepting material are carried out in the presence of a polymer or precursor thereof.

DETAILED DESCRIPTION OF THE INVENTION

The electron-donating material which can be used in the present invention includes tetrathiafluvalene (TTF), BEDT-TTF, tetraaminoanthraquinone (TAAQ), dimethyl(ethylenedithio)diselenadithiafulvalene (DMET), tetramethyltetraselenafulvalene (TMTSF), and methylenedithiotetrathiafulvalene (MDT-TTF).

The electron-accepting material which can be used in the present invention includes I$_3$, IBr$_2$, AuI$_2$, AuCl$_2$, AuBr$_2$, Au(CN)$_2$, (I$_3$)$_{1-x}$(AuI$_2$)$_x$ (wherein x represents a positive number less than 1), Hg$_3$Br$_8$, ClO$_4$, ReO$_4$, Cu(SCN)$_2$, Ni(dmit)$_2$, Pd(dmit)$_2$, PF$_6$, AsF$_6$, SbF$_6$, TaF$_6$, and FSO$_3$ (wherein dmit represents dimercaptoisotrithione).

Examples of the organic superconductive substance synthesized from the electron-donating material and electron-accepting material include (TMTSF)$_2$X$^1$ (wherein X$^1$ represents ClO$_4$, etc.), (BEDT-TTF)$_2$X$^2$ (wherein X$^2$ represents I$_3$, (I$_3$)$_{1-y}$(AuI$_2$)$_y$, IBr$_2$, AuI$_2$, Cu(SCN)$_2$, etc., wherein y represents a positive number less than 1), (DMET)$_2$X$^3$ (wherein X$^3$ represents AuCl$_2$, AuBr$_2$, I$_3$, IBr$_2$, etc. (MDT-TTF)$_2$X$^4$ (wherein X$^4$ represents AuBr$_2$, AuI$_2$, etc.) , TTF(Me(dmit)$_2$) (wherein Me represents Ni, Pd, etc.), and (CH$_3$)$_4$N(Ni(dmit)$_2$)$_2$. Among these, (BEDT-TTF)$_2$Cu(NCS)$_2$ is preferred.

The polymer and precursors thereof which can be used in the present invention is not particularly limited as long as it is dissolved in or swollen with a solvent used. Examples of the polymer and precursors thereof include polycarbonate; poly(methyl methacrylate); polyethylene; polystyrene; polypropylene; poly(vinyl chloride); polysiloxane; poly(vinylidene fluoride); poly(vinylidene chloride); polyamide; polypeptide; vinylidene fluoride-tetrafluoroethylene copolymers; polvacrylonitrile; polymers having —COOH, —OH, —SO$_3$H, —NH$_2$, >NH, —N=, —C≡N, —SH, etc.; ionic polymers, such as an ethylene-vinyl acetate copolymer and a methyl methacrylate-methacrylic acid copolymer; and electrically conductive polymers having ionic conductivity or electronic conductivity, which are preferably soluble in a solvent, e.g., a polyalkylthiophene and a polyphenylenevinylene precursor.

These polymers or precursors thereof are used as dissolved in or swollen with a solvent. Examples of the solvent for dissolving or swelling the polymer and dissolving the electron-donating material and the electron-accepting material as well include 1,1, 2-trichloroethane, tetrahydrofuran (THF), acetonitrile, benzonitrile, methylene chloride and mixtures thereof. (n-Bu$_4$N)SCN (wherein Bu is a butyl group) and CuSCN may be used as materials capable of forming an anion, Cu(NCS)$_2$$^-$.

The methods and conditions for the synthesis and crystal growth of the organic superconductive substance through oxidation-reduction can be in accordance with a known electrolytic technique as described, e.g. , in F. Beck, *Electroorganische Chemie, Verlag Chemie*, (1974) and D. Jerome et al, *J. Physique Letters*, 41, L-95 (1980) incorporated herein by reference.

The concentration of the polymers or precursors thereof during the synthesis and crystal growth can be determined in view of the weight ratio of the organic superconductive substance to the polymer in the final superconductive material of the present invention.

After completion of the synthesis and crystal growth of the organic superconductive substance, the reaction system is dried to remove the solvent thereby obtaining an organic superconductive material comprising a polymer matrix having dispersed therein crystals of the organic superconductive substance. After removing the solvent, unreacted electron-donating material and electron-accepting material can be removed by a conventional manner such as extraction.

According to the present invention, since the synthesis of the organic superconductive substance is carried out in the presence of a polymer, crystal of high quality can grow, although the crystal size is as small as 0.1 mm or less.

The weight ratio of the organic superconductive substance to the polymer in the superconductive material of the present invention is preferably from 0.5 to 90 wt %, more preferably from 5 to 75 wt %, and particularly preferably from 40 to 60 wt %. If it is less than 0.5 wt %, the conductivity tends to be insufficient, and it is more than 90 wt %, the shaping properties tend to be deteriorated.

Even where a polymer having no electrical conductivity is used and, also, the weight ratio of the organic superconductive substance to the polymer is as low as about 1 wt %, the superconductive material of the present invention exhibits electrical conductivity at room temperature. It is thus believed that the individual crystallites form a continuous passage of electrical conduction at room temperature.

Where an electroconductive polymer is used, superconductive materials having a conductivity of $10^2$ to $10^4$ S/cm at room temperature can be obtained., While the organic superconductive substance per se, which constitutes the superconductive material of the present invention, is brittle and lacks flexibility and bending properties, the organic superconductive material of the invention, in which the fine crystallites of the organic superconductive substance are dispersed in the polymer matrix, exhibits excellent flexibility or bending properties. Further, the superconductive material of the present invention can be processed into fibers, films, or the like shape. It is possible to dissolve the superconductive material in a solvent capable of dissolving the polymer matrix to prepare a superconductive paint. Furthermore, the organic superconductive material prepared using a polymer having a melting point lower than that of the organic superconductive crystallites can be subjected to melt-processing such as extrusion molding into fibers, films, plates, rods, pipes, etc.

If desired, the fiber, etc., obtained by processing the organic superconductive material of the invention can be subjected to stretching to orientate the polymer molecules. The stretched fiber or film has improved superconductive characteristics, such as critical current density (Jc). In addition, the orientation of the polymer molecules attains an improvement of mechanical strength of the material.

The present invention is now illustrated in greater detail by way of the following Examples, but it should be understood that the present invention is not deemed to be limited thereto.

EXAMPLE 1

100 ml of THF (purified by dehydration with calcium hydride, refluxing in the presence of sodium and benzophenone until colored, followed by distillation), 70 mg of CuSCN (purified by removing potassium thiocyanate and copper(II) in a usual manner), and 250 mg of (n-Bu$_4$N)SCN were charged in a cell for crystal growth and mixed together to prepare a solution of Cu(NCS)$_2^-$, a counter anion of BEDT-TTF hereinafter described.

30 mg of BEDT-TTF (purified by recrystallization from chlorobenzene) and 100 mg of a vinylidene fluoridetetrafluoroethylene copolymer were added to the above-prepared solution, and the mixture was sufficiently stirred to prepare a uniform solution while displacing the air in the cell with an argon gas to make the inner atmosphere inert.

A direct current of from 1 to 2 μA was applied to the resulting solution at 20°C. for 3 days to allow the crystals to grow.

After completion of the synthesis and crystal growth, the crystals precipitated and deposited on the electrodes and the inner wall of the cell (crystal length: 0.01 to 0.1 mm) were collected in the resulting solution.

The solvent, THF, of the solution was removed under reduced pressure, and the residue was dried and solidified to obtain a solid organic super-conductive material. The solid was ground and extracted successively from water, ethanol and chloroform to remove any unreacted electron donating material and electron accepting material used to thereby obtain a purified organic super-conductive material comprising a polymer matrix having dispersed therein microcrystals of (BEDT-TTF)$_2$Cu(NCS)$_2$.

Finally, the purified organic super-conductive material was dissolved in THF, and the solution was cast over a glass plate to prepare a superconductive film having a thickness of 200 μm.

The conductivity of the resulting film at 25°C. was 5 S/cm as measured with a direct current four-terminal method.

The temperature-dependence of electrical resistance of the superconductive film was determined. As a result, the film showed electrical characteristics as a semiconductor at a temperature range of from 100K to room temperature, but the electrical resistance drastically fell at 10K probably due to formation of a superconductive phase. Incidentally, the Tc of 10K is close to Tc of 9K of currently employed NbTi wires.

EXAMPLE 2

The superconductive film obtained in Example 1 was uniaxially stretched at a stretch ratio of 2 at room temperature. The conductivity of the stretched film at 25° C. was about 20 S/cm as measured in the same manner as in Example 1, which was almost equal to the conductivity of a single crystal of (BEDT-TTF)$_2$Cu(NCS)$_2$.

The temperature dependence of electrical resistance of the stretched film was determined. As a result, electrical resistance drastically fell at a temperature of 10K, probably due to formation of a superconductive phase.

EXAMPLE 3

30 mg of BEDT-TTF, 70 mg of CUSCN, 126 mg of KSCN, 210 mg of 18-crown-6-ether, 96 ml of 1,1,2-trichloroethane and 3.6 ml of ethanol were charged in a cell for crystal growth of whose inner atmosphere had been substituted with nitrogen. The mixture was well stirred, and 25 mg of poly(3-octyl thiophene), a known soluble conductive polymer, was added thereto, followed by being well stirred. The cell containing the mixture was provided with a gold electrode (10×20×0.1 mm) as an anode and a platinum wire electrode (diameter: 1 mm) as a cathode under a nitrogen stream.

The cell was placed in a thermostat maintained at 20.0° C.±0.2° C. After the temperature of the cell became stable, a direct current of 10 μA was applied for 3 days to allow the crystals to grow.

After completion of the synthesis and crystal growth, the crystals precipitated and deposited on the electrodes and the inner wall of the cell were collected in the resulting solution.

The solvent, 1,1,2-trichloroethane, of the solution was removed under reduced pressure, and the residue was dried and solidified to obtain a solid organic superconductive material. The solid was ground and extracted successively from water, ethanol and acetonitrile to remove any unreacted electron donating material and electron accepting material used and the potassium crown ether complex produced to thereby obtain a purified organic superconductive material of the present invention.

The thus-obtained organic superconductive material was press-molded with a hot-press at 140° C. to obtain a film. The conductivity of the film at room temperature (25° C.) was 10 S/cm.

The temperature-dependence of electrical resistance of the superconductive film was determined. At a temperature of from room temperature to 90K, the electrical resistance was slightly increased. At 90K or less, the superconductive film exhibited metal-like electrial properties, and the electrical resistance of the film fell at 10K.

The direct current magnetization of the film was measured. The Meissner effect was observed at 10K, and thereby the superconductive was confirmed.

As described above, the organic superconductive material according to the present invention ha excellent processability and can easily be molded into fibers, films, etc. Further, the material can be coated on other materials. Furthermore, it is light-weight as compared with metallic and ceramic superconductive materials. From these characteristics, the organic superconductive material of the invention is suitable for various uses, such as wires, tapes, strip lines, circuits, magnetic screening devices, ant the like. Accordingly, the present invention produces excellent effects.

While the invention has been described in detail and with reference to specific embodiments thereof, it will be apparent to one skilled in the art that various changes and modifications can be made therein without departing from the spirit and scope thereof.

What is claimed is:

1. A process for producing an organic superconductive material comprising subjecting a solution of an electron-donating material selected from the group consisting of an organic electron-donating material having a tetrathiafulvalene structure and an organic electron-donating material having an anthraquinone structure and an electron-accepting material selecting from the group consisting of a halogen ion, a metal halide, a metal thiocyanate, a perchlorate, a metal oxide, a metal dimercaptoisotrithione complex and $FSO_3-$ in a solvent to electrochemical oxidation-reduction to synthesize an organic superconductive substance and removing the solvent, wherein said oxidation-reduction and removal of the solvent and unreacted electron-donating material and electron-accepting material are carried out in the presence of a polymer.

2. A process as claimed in claim 1, wherein said polymer is an electrically conductive polymer having ionic conductivity or electronic conductivity.

3. A process as claimed in claim 1, wherein said polymer or a precursor thereof is soluble in said solvent.

4. A process as claimed in claim 1, wherein said organic superconductive substance is $(BEDT-TTF)_2Cu(NCS)_2$, and said solvent is 1,1,2-trichloroethane or tetrahydrofuran.

5. A process as claimed in claim 1, wherein
said organic electron-donating material having a tetrathiafluvalene structure is selected from the group consisting of tetrathiafulvalene, bis(ethylenedithiatetrathia)fulvalene, dimethyl(ethylenedithio)diselenadithiafulvalen, tetramethyltetraseleafulvalene and methylenedithiotetrathiofulvalene; and
said organic electron-donating material having an anthraquinone structure is tetraaminoanthraquinone.

6. A process as claimed in claim 1, wherein
said halogen ion is selected from the group consisting of $I_3$ and $IBR_2^-$;
said metal halide is selected from the group consisting of $AuI_2^-$, $AuCl_2^{31}$, $AuBr_2^-$, $Au(CN)_2^-$, $(I_3)_{1-x}(AuI_2)_x^-$, wherein x represents a positive number less than 1, $Hg_3Br_8^-$, $PF_6-$, $AsF_6-$, $SbF_6-$, and $TaF_6^-$;
said metal thiocyanate is $Cu(SCN)_2^-$;
said perchlorate is $ClO_4^-$;
said metal oxide is $ReO_4^-$;
said metal dimercaptoisotrithione complex is selected from the group consisting of $Ni(dmit)_2^-$ and $Pd(dmit)_2^-$, wherein dmit represents dimercaptoisotrithione; and
said polymer is selected from the group consisting of polycarbonate , poly(methyl methacrylate), polyethylene, polystyrene, polypropylene, poly(vinyl chloride), polysiloxane, poly(vinylidene fluoride), poly(vinylidene chloride), polyamide, polypeptide, vinylidene fluoride-tetrafluoroethylene copolymers, polyacrylonitrile, polymers having at least one of —COOH, —OH, —SO$_3$H, —NH$_2$, >NH, —N=, —C≡N and —SH, ionic polymers, and electrically conductive polymers having ionic conductivity or electronic conductivity.

* * * * *